United States Patent [19]

Shepherd et al.

[11] Patent Number: 5,796,155
[45] Date of Patent: Aug. 18, 1998

[54] SCHOTTKY BARRIER INFRARED DETECTOR ARRAY WITH INCREASED EFFECTIVE FILL FACTOR

[75] Inventors: Freeman D. Shepherd, Chelmsford; Jonathan M. Mooney, Winchester, both of Mass.

[73] Assignee: The United States of America as represented by the Secretary of the Air Force, Washington, D.C.

[21] Appl. No.: 903,392

[22] Filed: Jun. 25, 1997

Related U.S. Application Data

[63] Continuation of Ser. No. 502,407, Jul. 14, 1995, abandoned.
[51] Int. Cl.[6] .................. H01L 27/146; H01L 31/07; H01L 31/108
[52] U.S. Cl. .................. 257/452; 257/450; 257/451
[58] Field of Search .................. 257/450, 452, 257/451, 449

[56] References Cited

U.S. PATENT DOCUMENTS

| | | | |
|---|---|---|---|
| 3,902,066 | 8/1975 | Roosild et al. | 250/332 |
| 4,531,055 | 7/1985 | Shepherd, Jr. et al. | 250/211 J |
| 4,544,939 | 10/1985 | Kosonocky et al. | 257/452 |
| 4,866,497 | 9/1989 | Kosonocky | 257/451 |
| 4,875,084 | 10/1989 | Tohyama | 257/451 |
| 5,565,676 | 10/1996 | Tanabe | 257/449 |

OTHER PUBLICATIONS

Tohyama et al *IEEE Trans. on Elec Dev.* vol. 41 No. 9 Sep. 94 "A Silicon Homojunction . . . $N^{++}$ Layer".

*Primary Examiner*—Jerome Jackson
*Attorney, Agent, or Firm*—William G. Auton

[57] ABSTRACT

An improvement of the design of Schottky barrier infrared detector (SBIR) arrays, as taught by Roosild, et al. We describe modifications of the detector unit cell design which maximize the fraction of detector electrode area exhibiting full spectral emission response. In particular we recommend changes in the impurity density profile, or "doping", under the Schottky electrode. The new detector cell design can result in a two-fold increase in the photoemission of SBIR arrays, which have small detector cell dimensions.

1 Claim, 6 Drawing Sheets

SCHOTTKY BARRIER INFRARED DETECTOR ARRAY WITH INCREASED EFFECTIVE FILL FACTOR

This application is a continuation, of application Ser. No. 08/502,407, filed Jul. 14, 1995, now abandoned

STATEMENT OF GOVERNMENT INTEREST

The invention described herein may be manufactured and used by or for the Government for governmental purposes without the payment of any royalty thereon.

BACKGROUND OF THE INVENTION

Schottky barrier infrared detector arrays have reached an advanced state of development. There is current production of platinum silicide PtSi) arrays with more than 300,000 detectors and experimental arrays with more than 1,000,000 detectors. The pixel dimensions of these arrays range from 17 um to 25 um. The following references describe prior art systems and are incorporated herein by reference:

S. A. Roosild, F. D. Shepherd, A. C. Yang and W. M. Shedd, "SCHOTTKY BARRIER INFRARED ARRAYS WITH CHARGE COUPLED DEVICE READOUT", U.S. Pat. No. 3,902,066, Aug. 26, 1975.

J. R. Tower, T. S. Villani, et al. "640×480 MWIR and LWIR camera system developments" Proc. SPIE, Vol. 1762, pp 386–400, 1992.

M. Kimata, N. Yutani, N. Tsubouchi and T. Seto, "High performance 1040×1040 element PtSi Schottky-barrier image sensor", Proc. SPIE, Vol. 1762, pp 351–360, 1992.

SUMMARY OF THE INVENTION

The architecture of current Schottky barrier IR detector arrays is derived from the design of earlier silicon based visible imaging devices. This architecture is not optimized for infrared emission. For example, Schottky arrays are usually fabricated on low impurity density semiconductor substrates. Typical substrate doping of PtSi/Si arrays is in the mid $10^{14}$ $cm^{-3}$. This doping density is similar to those used in visible imaging devices and is consistent with the requirement for long minority carrier lifetime in charge coupled read out devices. However, the low substrate doping level will result in a relatively wide p-depletion region under the Schottky electrode. The wide depletion region will reduce the detector effective active area resulting in a reduced emission efficiency. The infrared photoemission efficiency of detectors having pixel dimensions described above is only 50 to 70% of the efficiency observed in large area test diodes fabricated on the same silicon wafer. The signal loss is noted as a reduction in the detector Fowler coefficient, Cf. We have determined that this reduction of emission efficiency is caused by local modulation of the Schottky barrier potential by the p-n junction guard ring in the silicon substrate of the detector. The Schottky barrier potential is increased in the areas above the p-depletion region, resulting in suppression of the detector infrared response. The net result is a reduction of the effective active detection area of the pixel. The present invention avoids the signal loss mechanism by means of changes in the Schottky detector doping profile which minimize the loss. In accordance with the present invention it has been found that the loss of signal, observed in small pixel size Schottky barrier arrays, can be minimized by increasing the substrate doping in the region immediately under the Schottky electrode. The width of the p-depletion region will be reduced by the doping increase, resulting in an increase in detector effective active area. The impurity density can be increased by ion implantation, diffusion or other means known to the art. The increase in substrate impurity concentration will result in some increase in dark current, caused by a slight "image lowering" of the detector Schottky potential. Normally, the above design change would be accomplished using only one additional lithographic mask during device fabrication. However, self alignment techniques could be exploited to eliminate the need for an additional mask.

The signal loss can also be minimized by increasing the substrate p-type doping in a narrow band inside the n-type guard ring implant under the Schottky barrier electrode. The band width will correspond to the narrower p-depletion width at the increased doping level. This second embodiment will minimize the signal loss without significant increase in dark current. The narrow band geometry requires slightly more complex lithographc procedures during fabrication.

In each of the above design changes, the increase in the local substrate impurity density reduces the width of the p-depletion region under the Schottky electrode. This results in an increase in the active area and the related infrared responsivity in the center of the electrode, where there is no modulation of the Schottky potential by the depletion field. The unmodulated region exhibits the full internal emission response. Thus, increasing the substrate doping gives an overall increase in both detector active area and infrared responsivity.

DESCRIPTION OF THE PREFERRED EMBODIMENT

Figure 1:
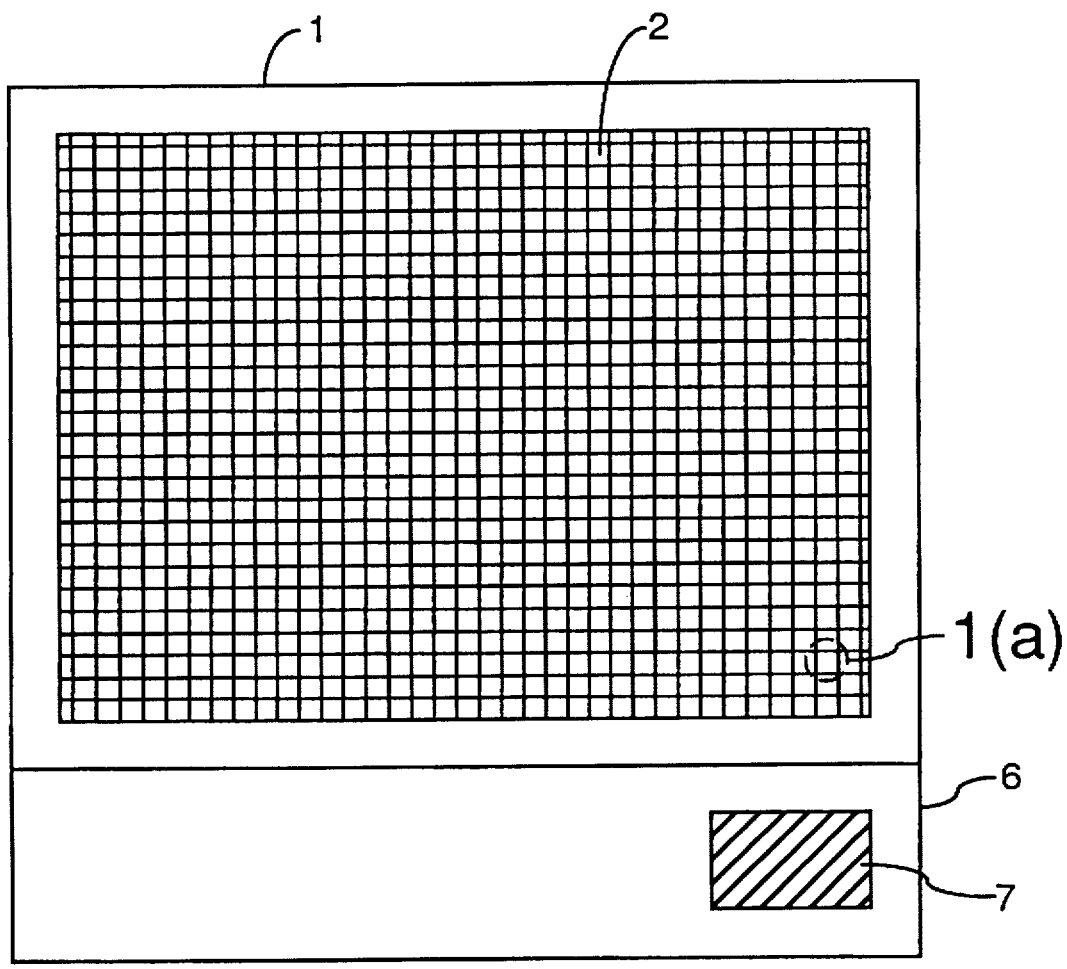
FIG. 1 is a pictorial representation of a Schottky barrier infrared detector array.
Figure 1A:
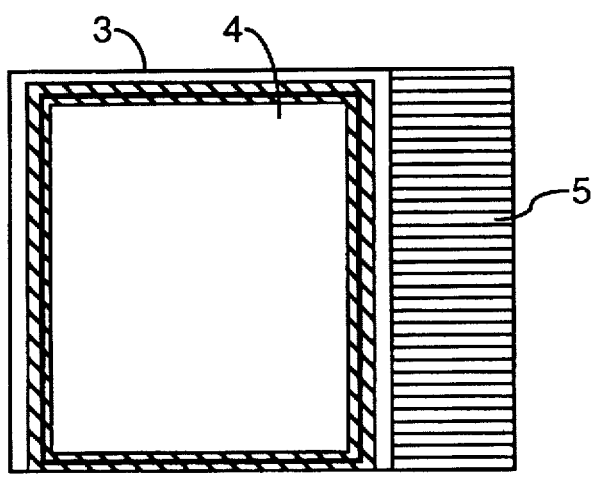

Referring to FIG. 1 of the drawings, there is shown a pictorial representation of the basic elements of a Schottky barrier focal plane array. This type of array detects infrared by internal emission, where photons are absorbed in the Schottky electrode resulting in emission of charge carriers into the semiconductor substrate. This differs from most other infrared arrays, where photon absorption takes place in the semiconductor. The array is fabricated on a semiconductor chip 1, by means known to the art. The array consists of a plurality of infrared detector elements 2, known as "pixels", which are aligned in one or two dimensions on the chip. An individual pixel is expanded 3, to show the active detector area 4 and one section of an integrated muliplexer network 5, which is employed to read out the signal. In the case of a hybrid focal plane array the multiplexer resides on a separate semiconductor chip which is bonded to the focal plane array by means known to the art. The current disclosure applies to both integrated and hybrid focal plane arrays. Infrared array manufacturers usually include a test chip 6 on the semiconductor wafer for process monitoring and initial device diagnostics. The test chip can also include a large area detector 7, for measurement of device dark current and photoemission parameters. Large area detectors, such as 7, are often found to have photoemission efficiency substantially greater than the efficiency of smaller dimension detectors on the same wafer.

Figure 2:
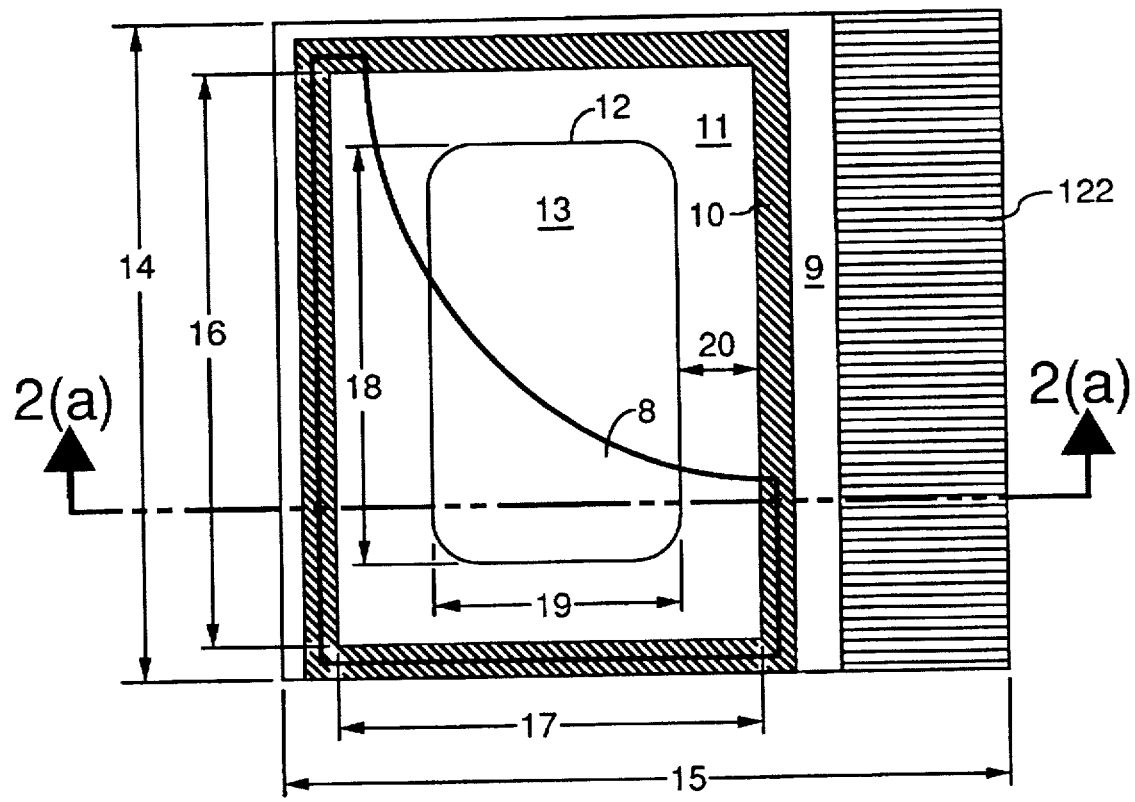
FIG. 2 is an expanded view of one Schottky barrier internal emission pixel, which is used to define the technology baseline and the terminology of this disclosure.
Figure 2A:
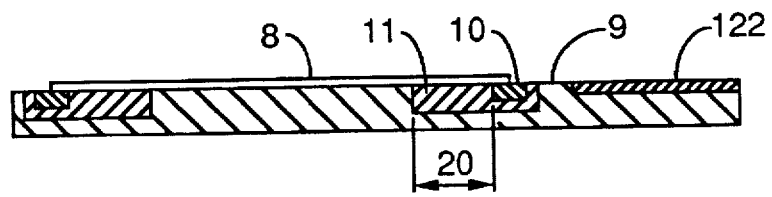

Referring to FIG. 2 of the drawings, there is shown a pictorial representation of a further expansion of a single pixel, showing the Schottky internal emission electrode 8 (in cut-away), the channel stop 9, which separates the pixel and multiplexer areas, the n-type guard ring implant 10, and the adjacent p-type depletion region 11, which extends under the Schottky electrode. The width of the p-depletion region is 20.

Detector pixels are characterized by a "fill factor", which is the ratio of active detecting area to the pixel area. It is assumed that there is uniform emission over the active area. It is current practice to consider the area inside the n-guard ring 10 to be the active area. Then, the fill factor is given by the product of height 16 and width 17, divided by the pixel area, the product of height 14 and width 15. This definition of fill factor is incorrect, because the emission varies with position over the electrode.

Figure 3A:
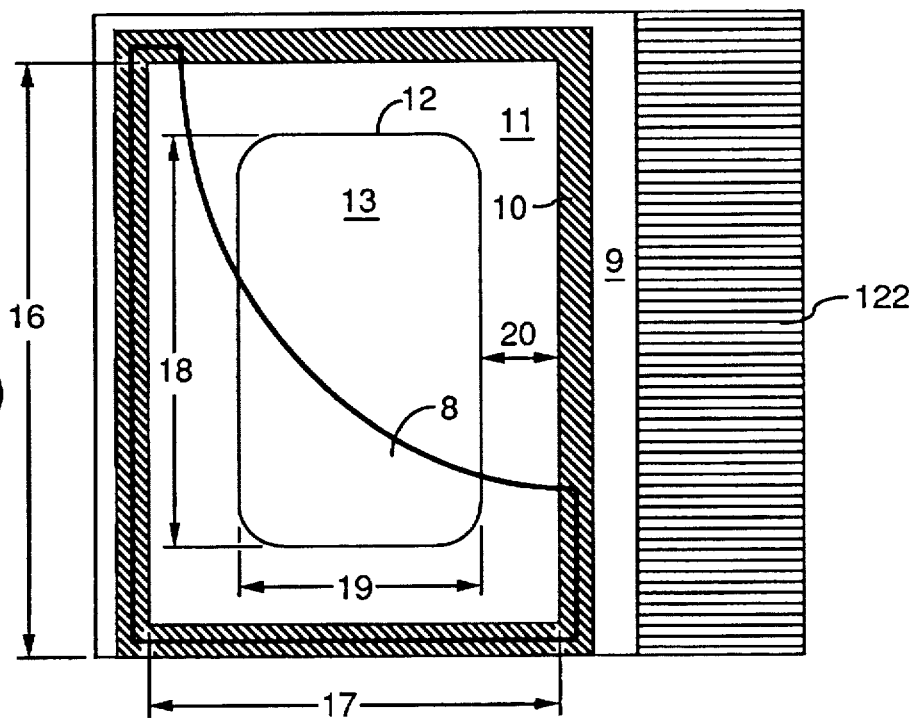
FIGS. 3(a)–3(c) give a pictorial representation of the variation of Schottky potential with position in the detector electrode and the related variation of infrared emission.
Figure 3B:
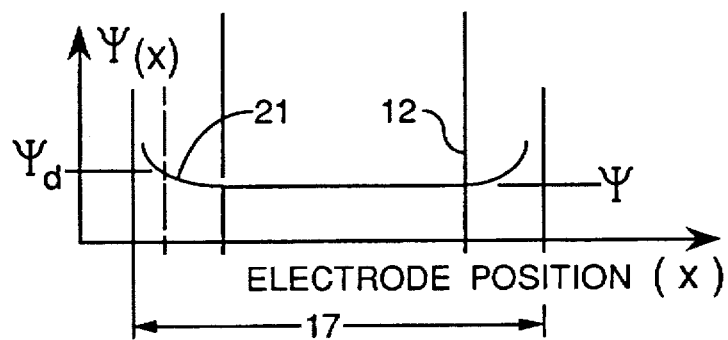
Figure 3C:
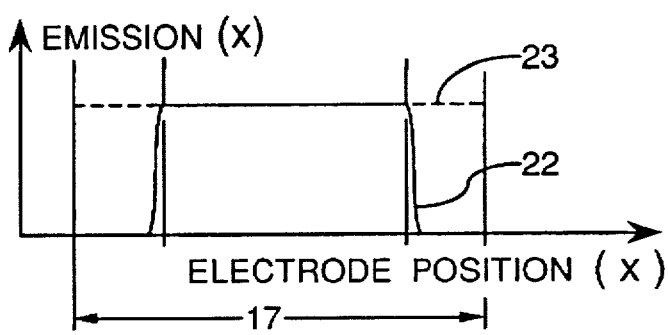

Referring to FIG. 3 of the drawings, there is shown a pictorial representation of the potential modulation across the pixel and the related variation of infrared emission. There is uniform photoabsorption in the Schottky electrode, inside the n-type implant 10. However, the resulting carrier emission is not uniform. Uniform emission is observed in the central region of the Schottky electrode 13, inside the inner edge 12, of the p-type depletion region 11. Outside edge 12, the depletion field causes the Schottky potential to rise as shown by curve 21 in FIG. 3b. The rise in potential suppresses photoemission by reducing the detection cut-off wavelength. FIG. 3c represents the expected emission profile 22, for a PtSi detector illuminated by 300 K background radiation in the 3 to 5 um spectral band. Also shown is the uniform response profile 23, of earlier models. The signal drops very rapidly in the depletion region. As a result, the active area is best approximated by the area inside the p-type depletion region and the fill factor is given by the product of height 18 and width 19, divided by the pixel area, the product of height 14 and width 15.

Figure 4:
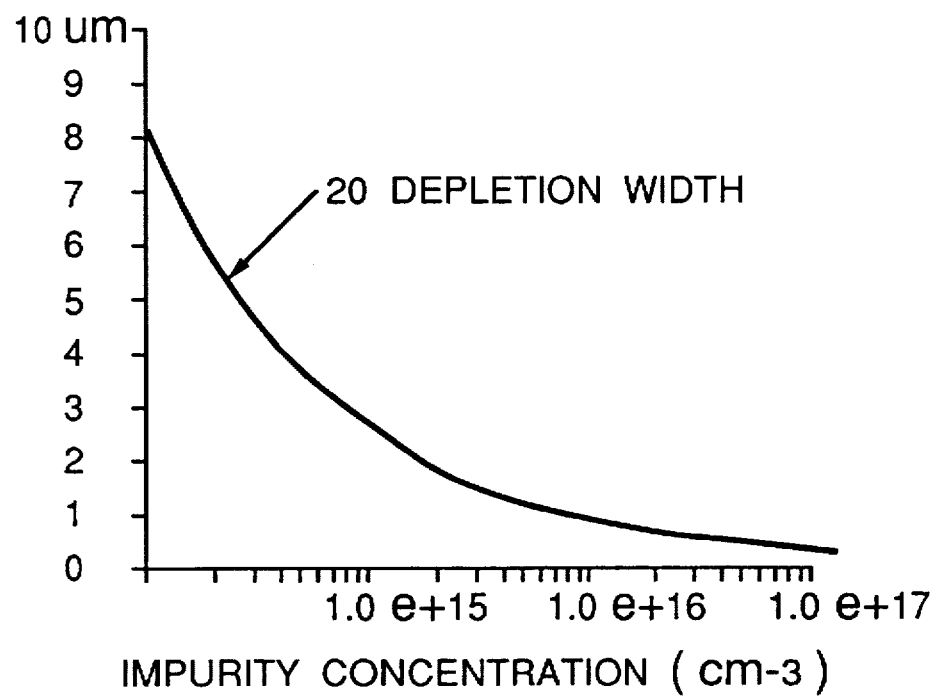
FIG. 4 gives the variation of the detector depletion width as a function of doping.

Note that there is negligible signal in the depletion region 11. The response of the device can be increased by modifying the doping profile of the pixel, so as to expand the depletion free region 13, by means of narrowing the p-depletion width 20. Most internal emission detectors are operated with a reverse bias. Referring to FIG. 4 of the drawings, there is shown the calculated depletion width 20, as a function of the substrate doping level. Results are given for an applied bias of 5 volts. This is a typical operating condition for Schottky detectors. Increasing the substrate doping immediately under the Schottky electrode, from the mid $10^{14}$ cm$^{-3}$ range to the mid $10^{16}$ cm$^{-3}$ range, reduces the p-depletion width 10-fold.

Figure 5:
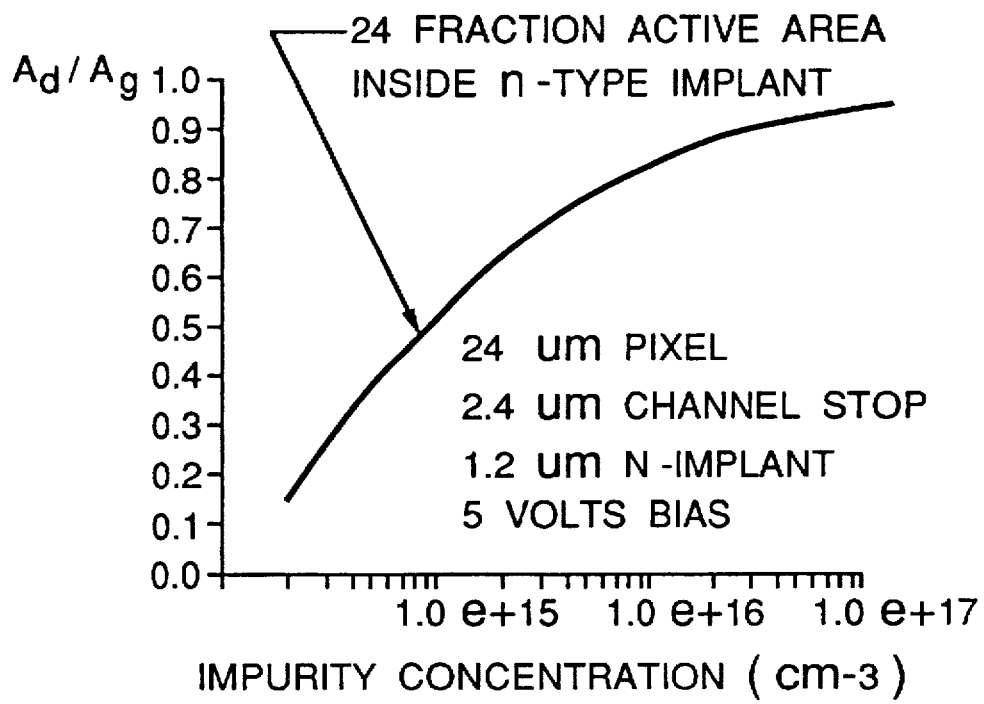
FIG. 5 gives the ratio of active detecting area to the area inside the detector guard ring implant.

Referring to FIG. 5 of the drawings, there is shown the calculated fraction of active area 24, inside the n-type implant. Curve 24 clearly demonstrates the improvement in active detecting area which will be obtained by increasing the substrate doping according to either of the embodiments of this disclosure. As the active area is increased there will be a proportional increase in detector photocurrent. Thus, the recommended changes in substrate impurity profile will result in an increase in the array responsivity.

Curve 24 can also be used to estimate correction factors for earlier sensor models, in which active area is equated with the area inside the n-type implant of the guard ring.

The calculation for curve 24 was based on a square 24 um pixel with nominal channel stop and guard ring dimensions. For simplicity, a hybrid design was considered, with no provision for multiplexer area in the pixel. Adding multiplexer area, or reducing the size of the pixel, will result in a more rapid increase in active ratio with doping.

Figure 6:
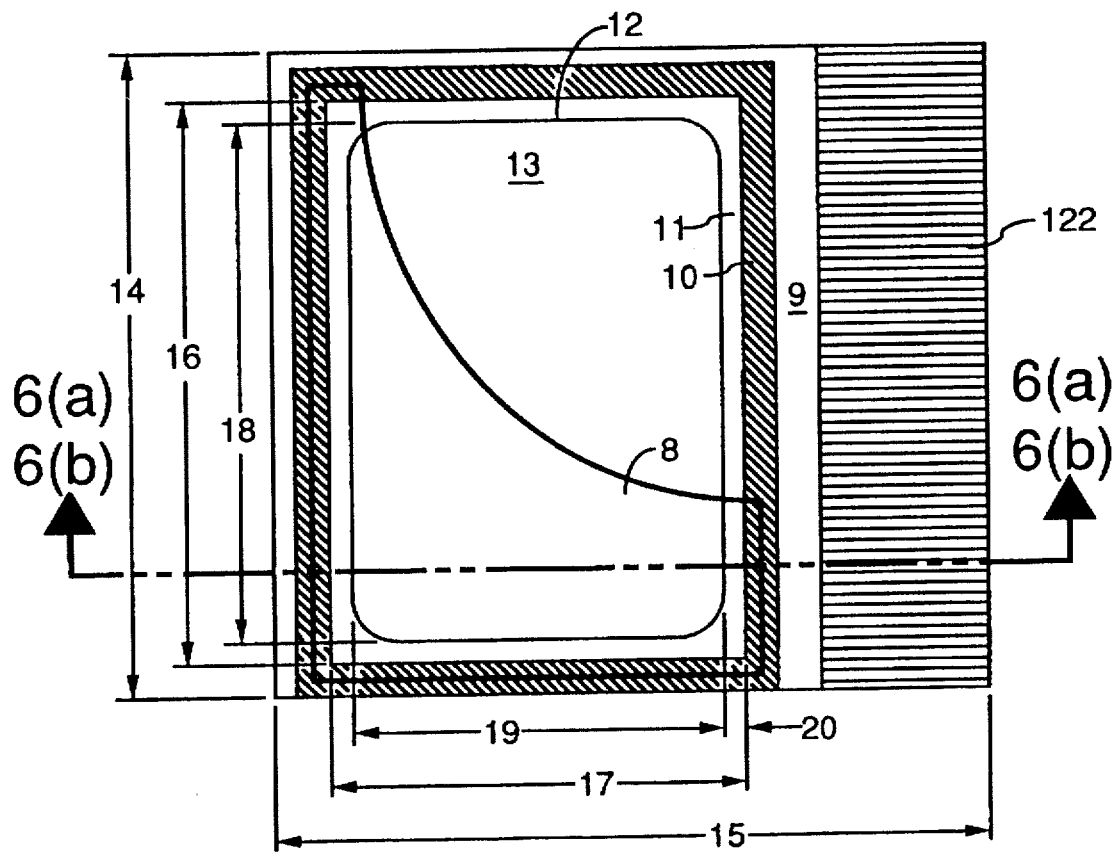
FIG. 6 is a pictorial representation of two new detector embodiments which have significantly increased active area and related increased photoemission.
Figure 6A:
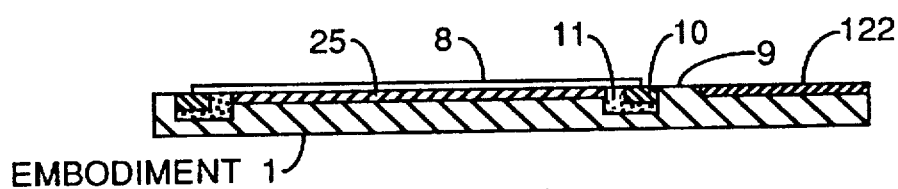
Figure 6B:
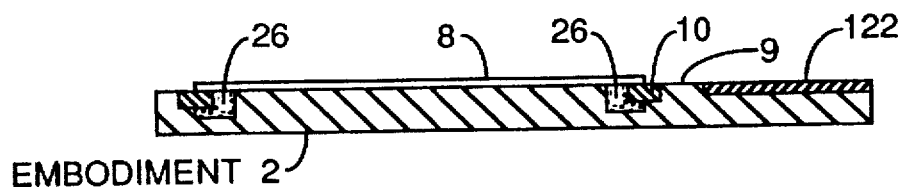

Referring to FIG. 6 of the drawings, there is shown a pictorial representation of the two proposed embodiments of the current invention. Note that there is a significant increase in active area, as a result of the decrease in the p-depletion width 20.

In Embodiment 1, a thin heavily doped p-type layer 25, has been formed under the Schottky electrode. The heavily doped layer 25, extends to the n-type implant. Layer 25 terminates the lateral spread of the p-depletion of the guard ring, resulting in a significant increase of the pixel active area. Layer 25 doping in the mid $10^{16}$ cm$^{-3}$ would result in a ten-fold reduction in the width of the depletion region 20 relative to the current use of substrate doping in the $10^{14}$ cm$^{-3}$ range. Adjustments may be required in the n-implant of the guard ring, to maintain the detector break-down voltage. Such adjustments are known to the art.

In Embodiment 2, a narrow heavily doped p-type band 26, has been added at the inside edge of the n-type guard ring implant, to terminate the lateral spread of the p-depletion region. Doping in the mid $10^{16}$ cm$^{-3}$ range is recommended. The p-type band can overlap the n-implant. The overlap region will be n-type as a result of the normally heavier doping of the guard ring n-implant.

Figure 7:
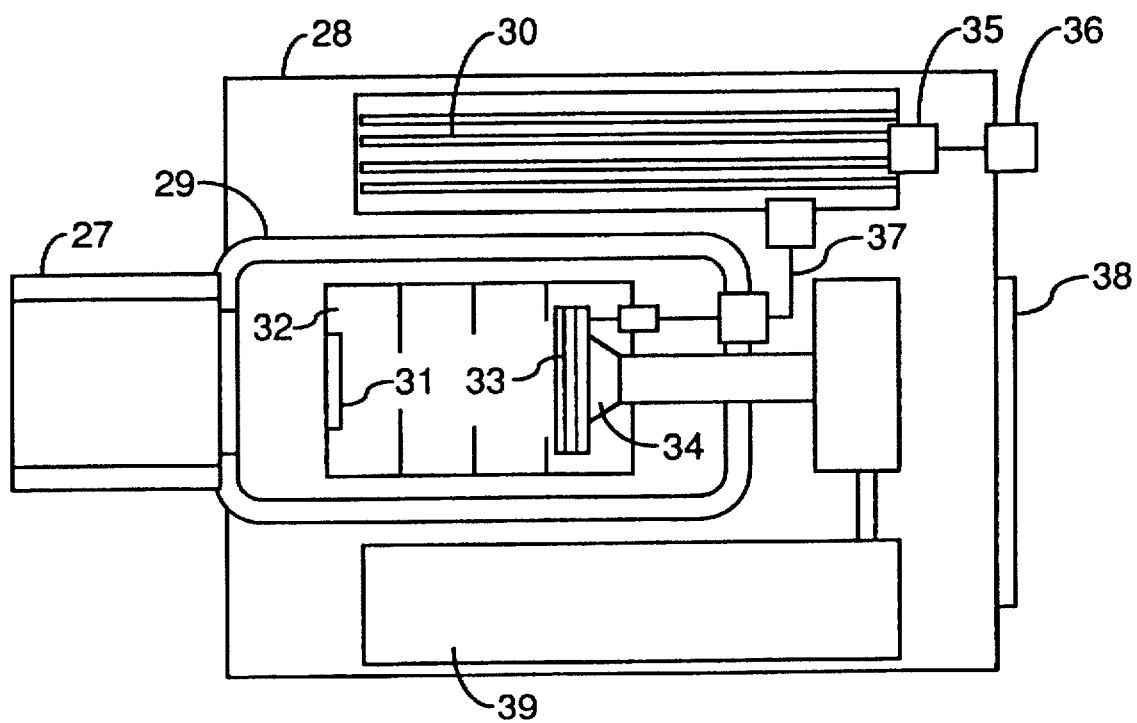
FIG. 7 is a schematic representation of an infrared camera which would have improved sensitivity derived from the increase of signal from a detector array which has been modified to have increased effective active area, as described in this disclosure.

Referring to FIG. 7 of the drawings, there is shown a pictorial representation of an infrared camera with improved sensitivity. Camera sensitivity has been improved by incorporation of an increased sensing area detector array, based on the design improvement embodiments of this disclosure. The infrared camera includes an infrared lens assembly 27, a camera body enclosure 28, a vacuum dewar assembly, with an infrared window 29, a sensor electronics assembly 30, a cold shield assembly 32, the improved effective active area infrared detector array 33, a focal plane mounting assembly on a cooler cold finger 34, and the cooler compressor 39. The focal plan is cooled to a temperature where thermionic emission from the detector array becomes negligible and the signal is dominated by photoemission. There is a cold stop and cold filter 31, mounted on the cold shield assembly at the exit pupil of the infrared lens. Internal 35, and external electrical connections 36, are shown, as is an internal cable assembly 37. The camera control panel is designated as 38. Other than for the improved response detector array 33, all details given in this drawing are known to the art.

This disclosure also applies to the case of Schottky internal emission photoelectrodes on n-type substrates. The p-type and n-type designations of the above disclosure are reversed. However, the same increase in active detection area and resultant improvement of infrared photoresponse will be obtained.

This disclosure applies to all Schottky barrier internal emission detectors and detector arrays which employ p-n junction guard rings in the substrate semiconductor to isolate detectors. It does not apply to arrays which employ depletion self guarding as taught by Shepherd, et al. in F. D. Shepherd, P. W. Pellegrini, C. E. Ludington and M. M. Weeks, "SELF-GUARDING SCHOTTKY BARRIER INFRARED DETECTOR ARRAY", U.S. Pat. No. 4,531,055, Jul. 23, 1985.

The invention is applicable to internal emission detectors with metal, metal silicide, degenerate semiconductor or degenerate semiconductor alloy Schottky electrodes.

A Schottky barrier diode is a metal electrode on a semiconductor substrate which can be used to detect infrared radiation. When the diode is illuminated by infrared radiation, photons are absorbed in the metal resulting in emission of charge carriers (electrons or holes) into the semiconductor. This process is known as internal photoemission. The long wavelength cut off of the internal emission process occurs when the photon energy equals the energy of the Schottky potential between the metal and semiconductor. Schottky diode arrays are used to image infrared scenes. The array is placed at the focal plane of an infrared camera. When the array is illuminated with the image of the infrared scene, charge is emitted from the array in proportion to the local infrared signal intensity. Over a video frame time, this emission results in the accumulation of a negative charge image on the metal elements of the array. The image is inverted and then read out as a video signal by an integral or bump bonded hybrid multiplexer circuit.

In current Schottky detector arrays, the active detecting area of each picture element (pixel) is thought to be the area inside the n-type guard ring, which is employed to prevent signal leakage between pixels. Contrary to this, we find the active area is reduced by lateral spreading of a p-type depletion region under the Schottky electrode. Over the depletion region, the diode Schottky potential is increased, causing a reduction in detector long wavelength cut-off and a resultant loss of signal. This loss of signal is observed as a reduction in detector active area.

Current technology charge coupled device (CCD) based platinum silicide Schottky IR detector arrays are usually fabricated on silicon substrates having impurity densities (doping) in the mid $10^{14}$ $cm^{-14}$ range. At normal detector operating biases these devices can exhibit lateral spread as wide as 5 um, a significant fraction of the active area dimension. The substrate doping is selected to optimize minority carrier lifetime and high charge transport efficiency during CCD signal read out. There has been no separate optimization of the Schottky detectors. PtSi detector arrays with silicon MOS transistor readouts are also fabricated on substrates with similar doping densities, probably as a result of oversight of the problem described in this disclosure.

The claims of this disclosure pertain to changes in the Schottky detector unit cell design which minimize said lateral spread of the p-depletion region, resulting in an increased active detection area. The claims also apply to Schottky detector arrays having said improved unit cell designs and infrared cameras with improved sensitivity derived from the use of detector arrays having said improved unit cell designs. In the above description p-type and n-type are interchanged for the case of Schottky electrodes on n-type substrates.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A Schottky barrier infrared detector comprising:

a semiconductor substrate which has a first p-type doping level ranging between $10^{14}$ $cm^{-3}$ and $10^{15}$ $cm^{-3}$;

a metallic photoemissive element which forms an active infrared detection area placed on said first semiconductor substrate to function as a photodetector in an infrared portion of the electromagnetic spectrum and produce a detector signal by internal photoemission of holes over an electrical barrier, where it has an interface with the semiconductor substrate;

an n-type guard ring implant with an outer edge and an inside edge that circumscribes the metallic photoemissive element, but whose lateral spreading of its p-type depletion region under said photoemissive element acts as an iris, which reduces the active infrared detection area of said photoemissive element, thereby reducing detector signal and producing a reduced active area in the active infrared detection area; and a second p-type doping region, in the semiconductor substrate, having a shape as a closed thin strip and open in its center, similar to a picture frame, beside and contiguous with the inside edge of the guard ring implant, at its interface with the metallic photoemissive element, which acts as a depletion termination barrier, wherein said second p-type doping region area has a second p-type doping level, in a region of the specified shape, that ranges between ten and five hundred times the first p-type doping level of the semiconductor substrate, thereby pinning the guard ring implant's p-depletion region very close to the inside edge of the n-type guard ring implant, thereby having the effect of dilating the iris caused by the depletion region, so as to recover most of the lost active area, resulting in an increase in detector signal and detector emission efficiency, and preserve thereby an original barrier height of the metallic photoemissive element, so as to avoid the necessity of additional cooling.

* * * * *